United States Patent
Lee et al.

(10) Patent No.: US 7,817,217 B2
(45) Date of Patent: Oct. 19, 2010

(54) LIQUID CRYSTAL DISPLAY DEVICE HAVING ESD PROTECTION FUNCTIONALITY

(75) Inventors: Sue-Chen Lee, Hsin-Chu (TW); Tsang-Hsiang Tsai, Hsin-Chu (TW)

(73) Assignee: Au Optronics Corp., Hsin-Chu (TW)

( * ) Notice: Subject to any disclaimer, the term of this patent is extended or adjusted under 35 U.S.C. 154(b) by 236 days.

(21) Appl. No.: 12/183,047

(22) Filed: Jul. 30, 2008

(65) Prior Publication Data

US 2009/0279008 A1  Nov. 12, 2009

(30) Foreign Application Priority Data

Apr. 23, 2008  (TW) ............... 97114807 A

(51) Int. Cl.
*G02F 1/133* (2006.01)
*H02H 9/00* (2006.01)

(52) U.S. Cl. ............ 349/40; 349/54; 361/91.1

(58) Field of Classification Search ........... None
See application file for complete search history.

(56) References Cited

U.S. PATENT DOCUMENTS 6,288,885 B1  9/2001  Jiang

| | | | |
|---|---|---|---|
| 2003/0020845 A1* | 1/2003 | Lee et al. | 349/40 |
| 2006/0092591 A1* | 5/2006 | Yuan et al. | 361/91.1 |
| 2006/0266475 A1* | 11/2006 | Kumar et al. | 156/312 |
| 2007/0236443 A1 | 10/2007 | Lee | |
| 2007/0268420 A1* | 11/2007 | Tsai et al. | 349/40 |
| 2008/0079887 A1* | 4/2008 | Liu | 349/149 |
| 2008/0165301 A1* | 7/2008 | Chang et al. | 349/40 |
| 2008/0180591 A1* | 7/2008 | Shie | 349/40 |
| 2008/0218652 A1* | 9/2008 | Kim et al. | 349/40 |

FOREIGN PATENT DOCUMENTS

TW  200719007  5/2007

* cited by examiner

*Primary Examiner*—Tina M Wong
(74) *Attorney, Agent, or Firm*—Winston Hsu; Scott Margo; Ming-Lee Teng

(57) ABSTRACT

A liquid crystal display (LCD) device having electrostatic discharge (ESD) protection functionality is disclosed. The LCD device includes a flexible printed circuit board, an LCD panel, a lighting module, a first ESD protection unit, and a second ESD protection unit. The lighting module is disposed on the flexible printed circuit board. The first ESD protection unit is disposed in the LCD panel and is coupled between the first end of the lighting module and the ground of the flexible printed circuit board. The second ESD protection unit is disposed in the LCD panel and is coupled between the second end of the lighting module and the ground of the flexible printed circuit board.

13 Claims, 6 Drawing Sheets

LIQUID CRYSTAL DISPLAY DEVICE HAVING ESD PROTECTION FUNCTIONALITY

BACKGROUND OF THE INVENTION

1. Field of the Invention

The present invention relates to a liquid crystal display (LCD) device having electrostatic discharge (ESD) protection functionality, and more particularly, to a liquid crystal display device having ESD protection functionality for lighting modules based on ESD protection mechanism installed in the LCD panel of the LCD device.

2. Description of the Prior Art

Because liquid crystal display (LCD) devices are characterized by thin appearance, low power consumption, and low radiation, LCD devices have been widely applied in various electronic products for panel displaying. In general, the LCD device comprises liquid crystal cells encapsulated by two substrates and a lighting module for providing a light source. The operation of an LCD device is featured by varying voltage drops between opposite sides of the liquid crystal cells for twisting the angles of the liquid crystal molecules of the liquid crystal cells so that the transparency of the liquid crystal cells can be controlled for illustrating images with the aid of the lighting module.

FIG. 1 is a schematic diagram showing a prior-art liquid crystal display device. As shown in FIG. 1, the liquid crystal display device 100 comprises an LCD panel 110 and a flexible printed circuit board 150. The LCD panel 110 comprises a gate driver 125, a source driver 135, a first electrostatic discharge (ESD) protection unit 120, and a second electrostatic discharge protection unit 130. Disposed on the flexible printed circuit board 150 are a lighting module 160, a third electrostatic discharge protection unit 170, and a fourth electrostatic discharge protection unit 180. The first electrostatic discharge protection unit 120 is coupled to the gate driver 125 for protecting the gate driver 125 from being damaged by ESD events. The second electrostatic discharge protection unit 130 is coupled to the source driver 135 for protecting the source driver 135 from being damaged by ESD events. The third electrostatic discharge protection unit 170 and the fourth electrostatic discharge unit 180 are coupled to opposite sides of the lighting module 160 for protecting the lighting module 160 from being damaged by ESD events.

FIG. 2 is a schematic diagram showing another prior-art liquid crystal display device. As shown in FIG. 2, the liquid crystal display device 200 comprises an LCD panel 210 and a flexible printed circuit board 250. The LCD panel 210 comprises a gate driver 225, a source driver 235, a first electrostatic discharge protection unit 220, and a second electrostatic discharge protection unit 230. Disposed on the flexible printed circuit board 250 are a lighting module 260 and a third electrostatic discharge protection unit 270. The ESD protection mechanism of the LCD panel 210 is identical to the ESD protection mechanism of the LCD panel 110 shown in FIG. 1. Two ends of the third electrostatic discharge protection unit 270 are coupled to opposite sides of the lighting module 260 for protecting the lighting module 260 from being damaged by ESD events.

It is noted that the electrostatic discharge protection units for protecting the lighting module in the aforementioned prior-art liquid crystal display device are disposed on the flexible printed circuit board as shown in FIG. 1 and FIG. 2. In general, the lighting module comprises a plurality of lighting units, and consequently there are several electrostatic discharge protection units disposed on the flexible printed circuit board for protecting the plurality of lighting units from being damaged by ESD events. That is, the plurality of lighting units in conjunction with corresponding electrostatic discharge protection units are required to put into the layout of the flexible printed circuit board. Accordingly, extra circuits of the corresponding electrostatic discharge protection units complicate the layout and fabrication of the flexible printed circuit board. Also, extra layout areas of the flexible printed circuit board are required to accommodate the extra circuits of the corresponding electrostatic discharge protection units.

SUMMARY OF THE INVENTION

In accordance with an embodiment of the present invention, a liquid crystal display device having ESD protection functionality is provided. The liquid crystal display device comprises a flexible printed circuit board, an LCD panel, a lighting module, a first electrostatic discharge protection unit, and a second electrostatic discharge protection unit. The lighting module is disposed on the flexible printed circuit board. The first electrostatic discharge protection unit is disposed in the LCD panel. The first electrostatic discharge protection unit comprises a first end and a second end. The first end of the first electrostatic discharge protection unit is coupled to a first end of the lighting module. The second end of the first electrostatic discharge protection unit is coupled to a ground of the flexible printed circuit board or a ground of the LCD panel. The second electrostatic discharge protection unit is disposed in the LCD panel. The second electrostatic discharge protection unit comprises a first end and a second end. The first end of the second electrostatic discharge protection unit is coupled to a second end of the lighting module. The second end of the second electrostatic discharge protection unit is coupled to the ground of the flexible printed circuit board or the ground of the LCD panel.

In accordance with another embodiment of the present invention, a liquid crystal display device having ESD protection functionality is provided. The liquid crystal display device comprises a flexible printed circuit board, an LCD panel, a lighting module, and an electrostatic discharge protection unit. The lighting module is disposed on the flexible printed circuit board. The electrostatic discharge protection unit is disposed in the LCD panel. The electrostatic discharge protection unit comprises a first end and a second end. The first end of the electrostatic discharge protection unit is coupled to a first end of the lighting module. The second end of the electrostatic discharge protection unit is coupled to a second end of the lighting module.

These and other objectives of the present invention will no doubt become obvious to those of ordinary skill in the art after reading the following detailed description of the preferred embodiment that is illustrated in the various figures and drawings.

DETAILED DESCRIPTION

Hereinafter, preferred embodiments of the present invention will be described in detail with reference to the accompanying drawings. Here, it is to be noted that the present invention is not limited thereto.

Figure 1:
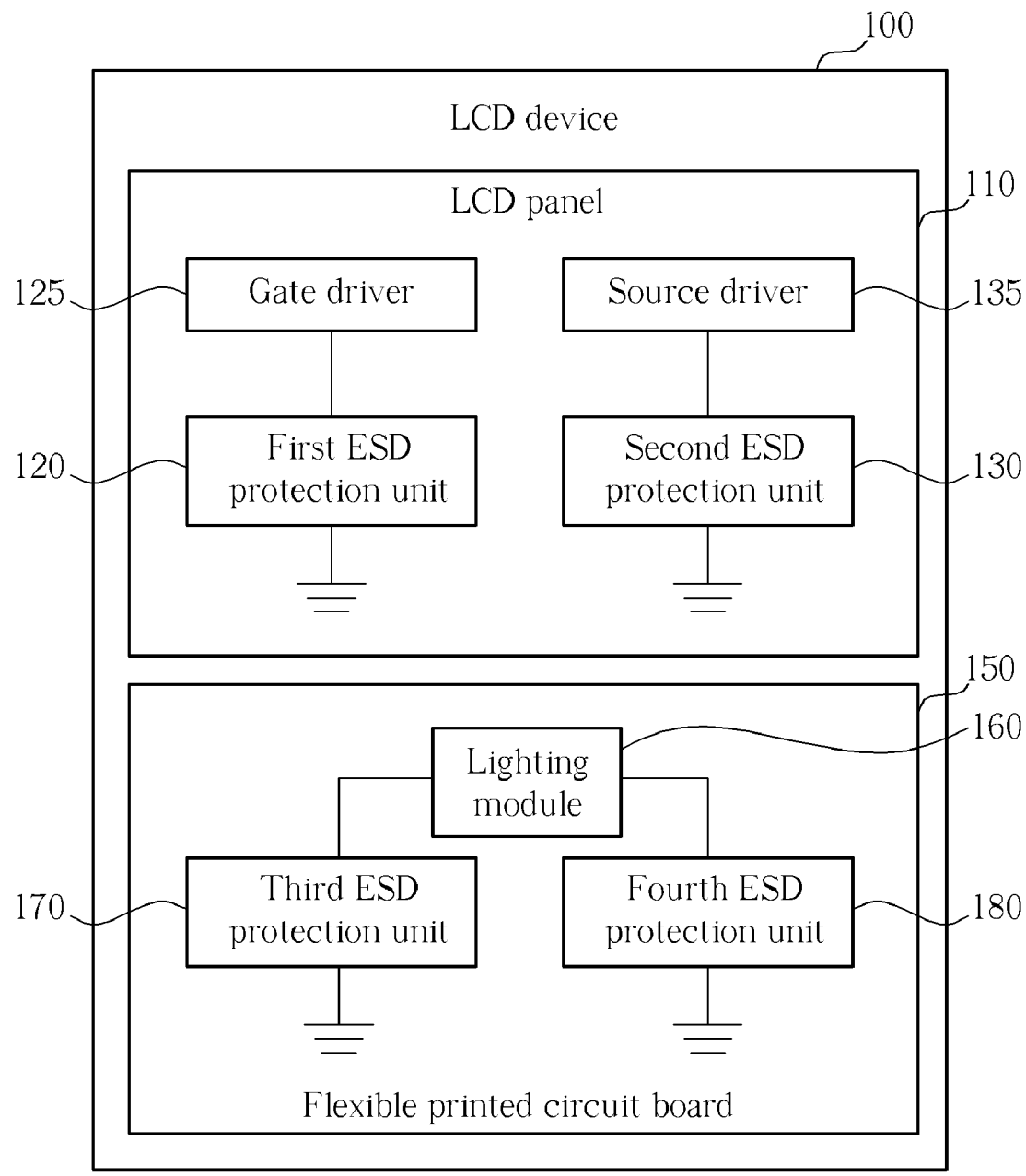
FIG. 1 is a schematic diagram showing a prior-art liquid crystal display device.
Figure 2:
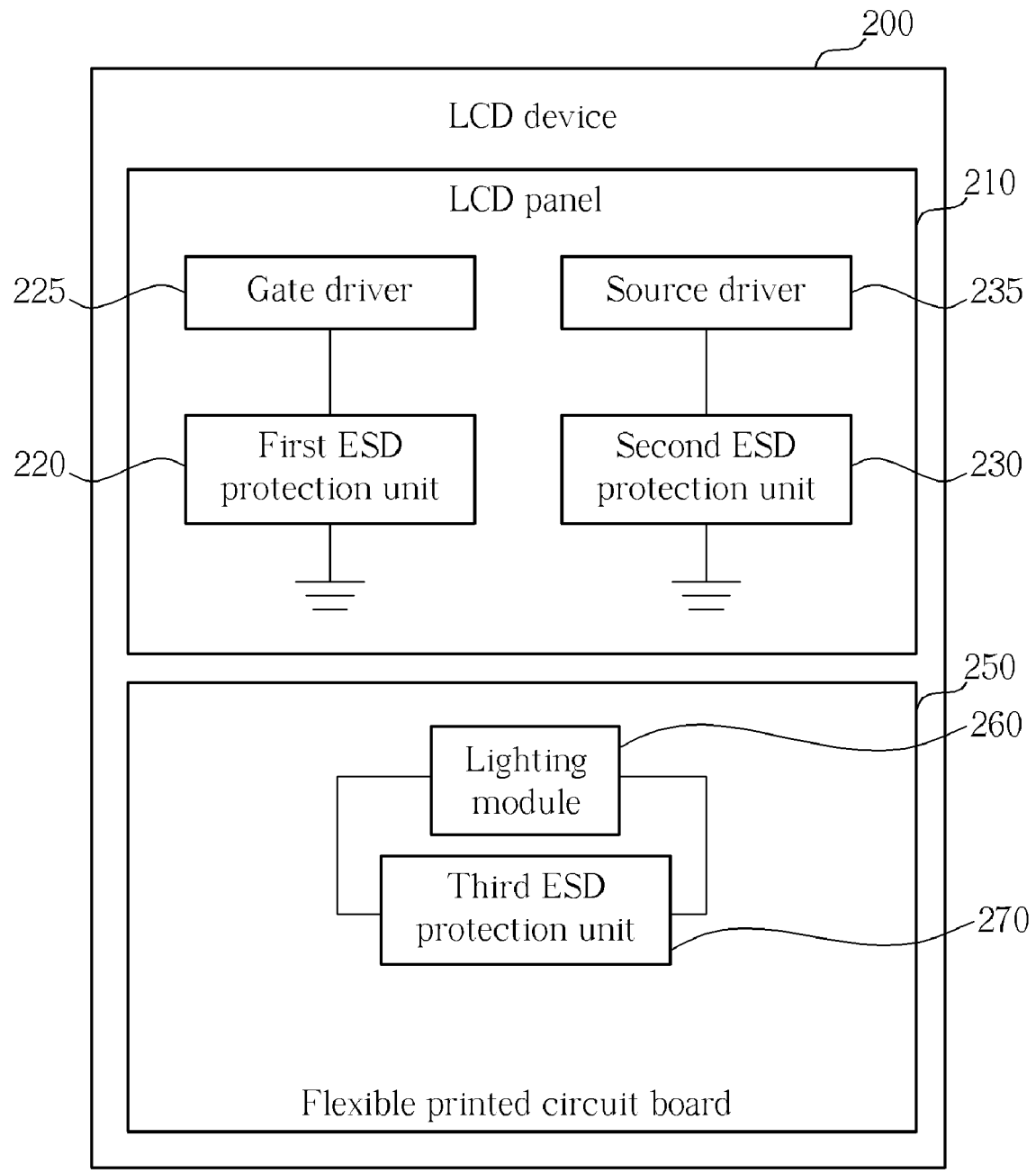
FIG. 2 is a schematic diagram showing another prior-art liquid crystal display device.
Figure 3:
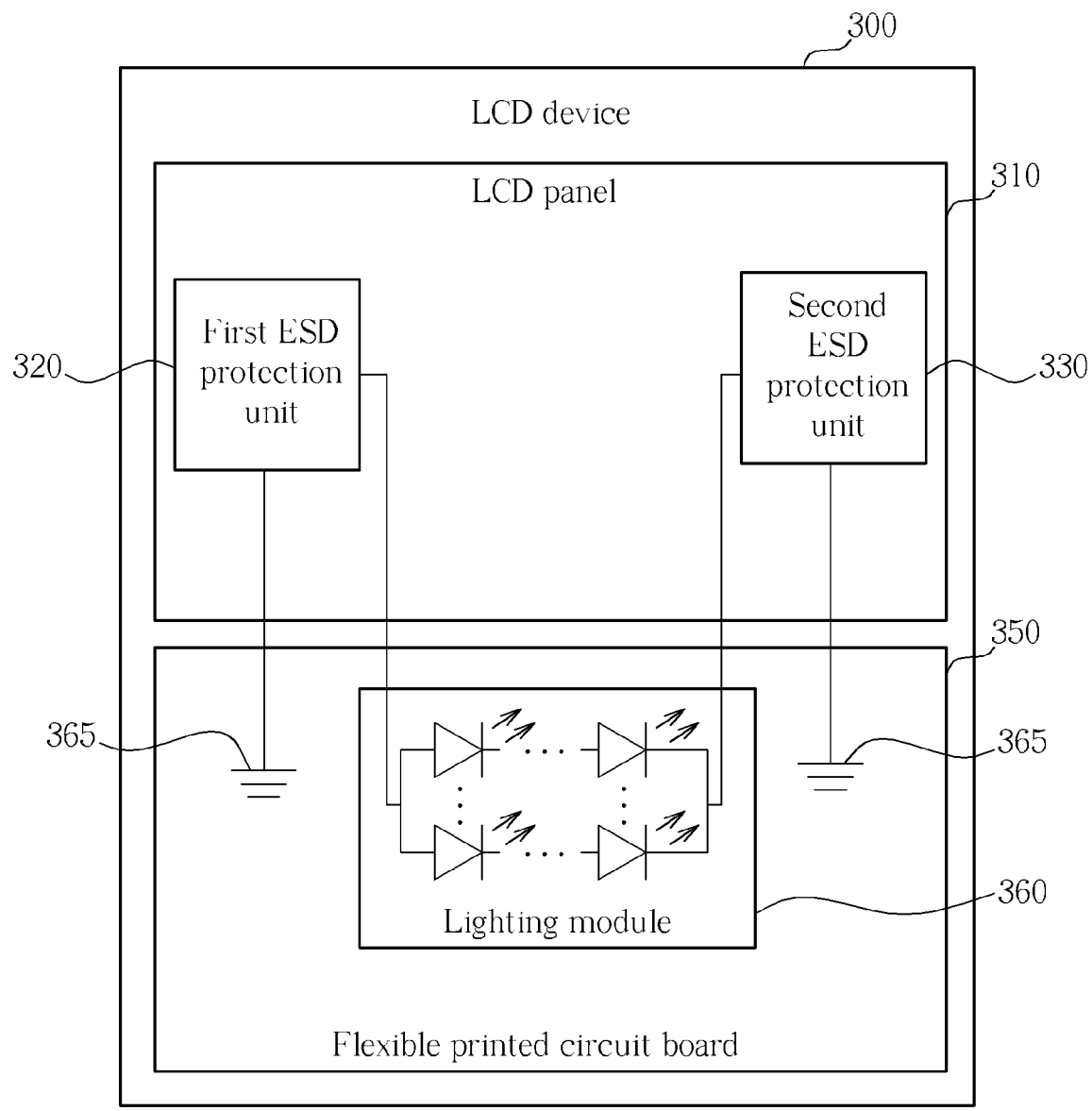
FIG. 3 is a schematic diagram showing a liquid crystal display device in accordance with a first embodiment of the present invention.

FIG. 3 is a schematic diagram showing a liquid crystal display device in accordance with a first embodiment of the present invention. As shown in FIG. 3, the liquid crystal display device 300 comprises an LCD panel 310 and a flexible printed circuit board 350. The LCD panel 310 comprises a first electrostatic discharge protection unit 320 and a second electrostatic discharge protection unit 330. The flexible printed circuit board 350 is disposed with a lighting module 360. The lighting module 360 may comprise a light emitting diode (LED) module having an LED unit or a plurality of parallel-connected LED units. Each LED unit comprises an LED or a plurality of series-connected LEDs. The first end of the lighting module 360 is coupled to the first end of the first electrostatic discharge protection unit 320. The second end of the lighting module 360 is coupled to the first end of the second electrostatic discharge protection unit 330. The second end of the first electrostatic discharge protection unit 320 is coupled to the ground 365 of the flexible printed circuit board 350. The second end of the second electrostatic discharge protection unit 330 is also coupled to the ground 365 of the flexible printed circuit board 350.

The first electrostatic discharge protection unit 320 and the second electrostatic discharge protection unit 330 can be varistors, transient voltage suppressors (TVS), clamp circuits, or filter circuits. If the first electrostatic discharge protection unit 320 and the second electrostatic discharge protection unit 330 comprise clamp circuits, then the clamp circuits are utilized to clamp voltage levels at the first and second ends of the lighting module 360 for avoiding unacceptable high voltage occurring to the first and second ends of the lighting module 360. If the first electrostatic discharge protection unit 320 and the second electrostatic discharge protection unit 330 comprise filter circuits, then the filter circuits are utilized to filter impulse noises occurring to the first and second ends of the lighting module 360. In one embodiment, the filter circuits can be capacitors for performing high-pass filter operations and passing the impulse noises to the ground 365.

In another embodiment, the second end of the first electrostatic discharge protection unit 320 or the second electrostatic discharge protection unit 330 can be coupled to the ground of the LCD panel 310. In summary, the electrostatic discharge protection mechanism for the lighting module 360 is provided based on the first electrostatic discharge protection unit 320 and the second electrostatic discharge protection unit 330 of the LCD panel 310 in the liquid crystal display device 300. In other words, the electrostatic discharge protection units for protecting the lighting module 360 are not required to be disposed on the flexible printed circuit board 350. That is, compared to the prior art, the layout and fabrication of the flexible printed circuit board 350 can be simplified significantly, and the layout area of the flexible printed circuit board 350 can be reduced significantly.

Figure 4:
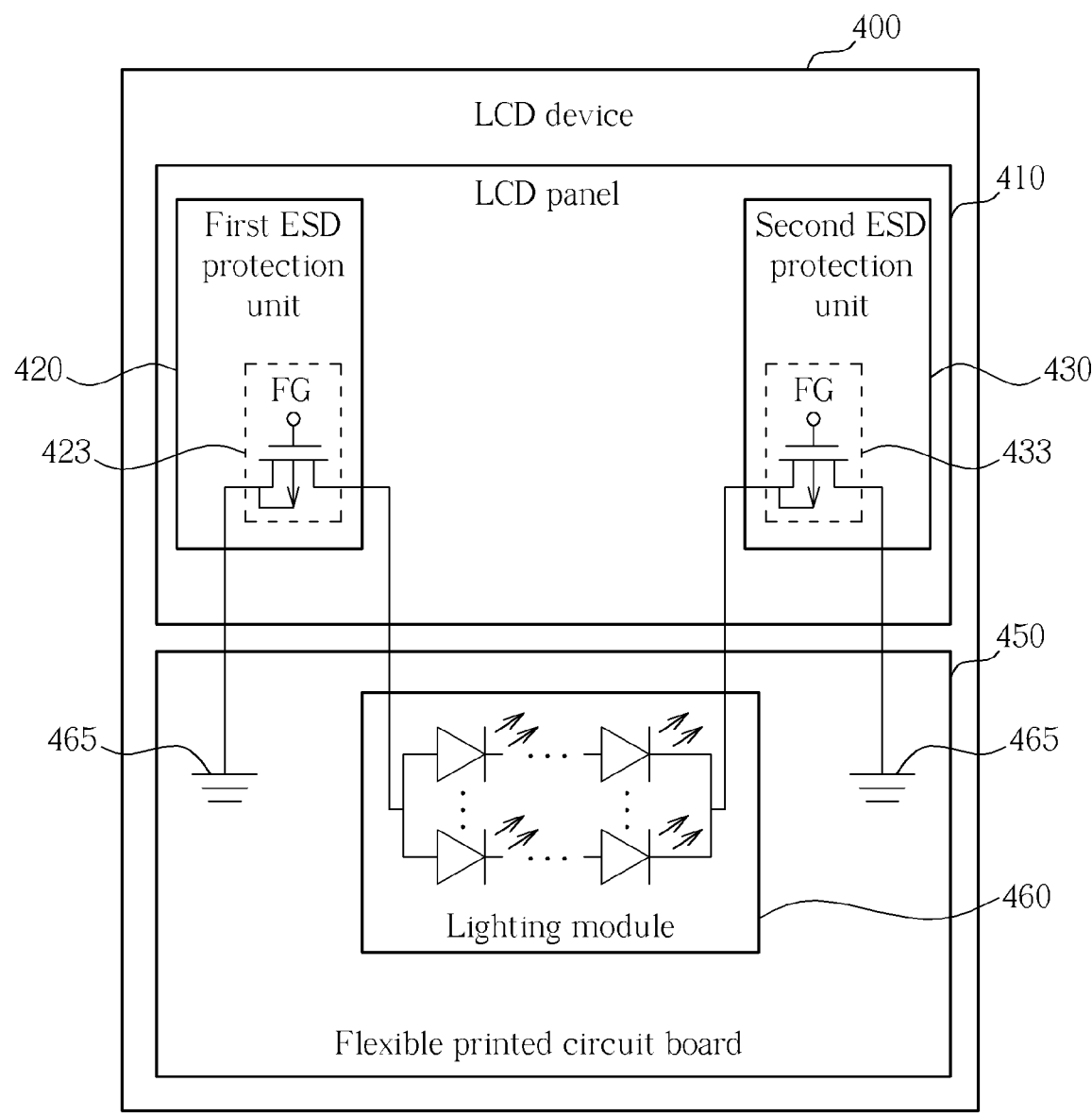
FIG. 4 is a schematic diagram showing a liquid crystal display device in accordance with a second embodiment of the present invention.

FIG. 4 is a schematic diagram showing a liquid crystal display device in accordance with a second embodiment of the present invention. The liquid crystal display device 400 comprises an LCD panel 410 and a flexible printed circuit board 450. The LCD panel 410 comprises a first electrostatic discharge protection unit 420 and a second electrostatic discharge protection unit 430. The flexible printed circuit board 450 is disposed with a lighting module 460. The lighting module 460 may comprise an LED module having an LED unit or a plurality of parallel-connected LED units. Each LED unit comprises an LED or a plurality of series-connected LEDs. The first electrostatic discharge protection unit 420 comprises a first transistor 423. The second electrostatic protection unit 430 comprises a second transistor 433. The first transistor 423 can be a metal-oxide-semiconductor (MOS) field effect transistor or a thin film transistor. The second transistor 433 can also be an MOS field effect transistor or a thin film transistor.

The first transistor 423 comprises a drain, a source, a channel well, and a gate. The drain of the first transistor 423 is coupled to the electrical-positive end of the lighting module 460. The electrical-positive end represents a current inlet terminal for inputting current while driving the lighting module 460 to emit light. The source of the first transistor 423 is coupled to the ground 465 of the flexible printed circuit board 450. The channel well of the first transistor 423 is coupled to the source of the first transistor 423. The gate of the first transistor 423 is a floating gate. The second transistor 433 comprises a drain, a source, a channel well, and a gate. The source of the second transistor 433 is coupled to the electrical-negative end of the lighting module 460. The electrical-negative end represents a current outlet terminal for sinking current while driving the lighting module 460 to emit light. The drain of the second transistor 433 is coupled to the ground 465 of the flexible printed circuit board 450. The channel well of the second transistor 433 is coupled to the source of the second transistor 433. The gate of the second transistor 433 is a floating gate. In another embodiment, the source of the first transistor 423 or the drain of the second transistor 433 can be coupled to the ground of the LCD panel 410.

Figure 5:
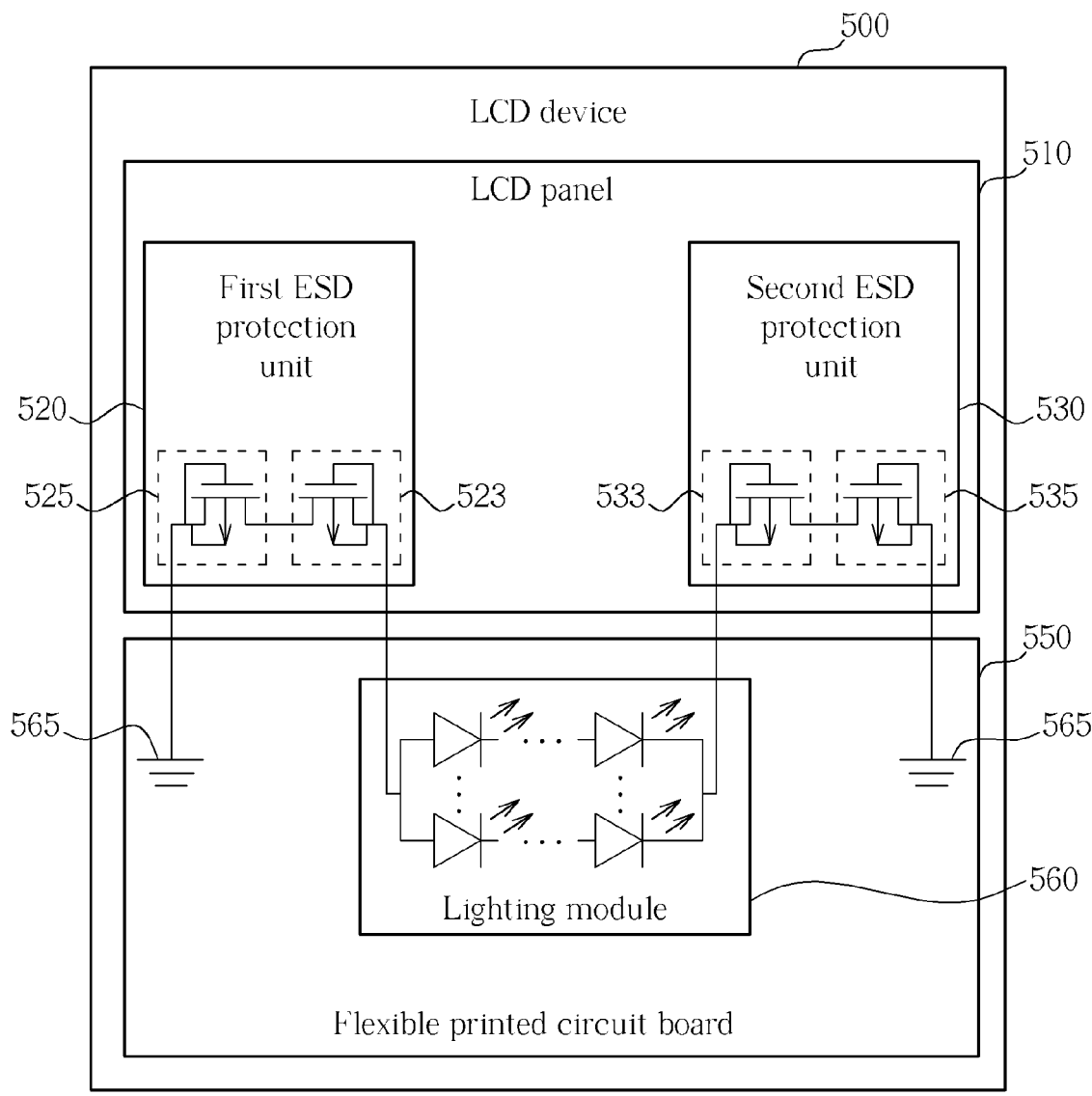
FIG. 5 is a schematic diagram showing a liquid crystal display device in accordance with a third embodiment of the present invention.

FIG. 5 is a schematic diagram showing a liquid crystal display device in accordance with a third embodiment of the present invention. As shown in FIG. 5, the liquid crystal display device 500 comprises an LCD panel 510 and a flexible printed circuit board 550. The LCD panel 510 comprises a first electrostatic discharge protection unit 520 and a second electrostatic discharge protection unit 530. The flexible printed circuit board 550 is disposed with a lighting module 560. The lighting module 560 may comprise an LED module having an LED unit or a plurality of parallel-connected LED units. Each LED unit comprises an LED or a plurality of series-connected LEDs. The first electrostatic discharge protection unit 520 comprises a first transistor 523 and a second transistor 525. The second electrostatic discharge protection unit 530 comprises a third transistor 533 and a fourth transistor 535. The first transistor 523 and the second transistor 525 can be MOS field effect transistors or thin film transistors. The third transistor 533 and the fourth transistor 535 can also be MOS field effect transistors or thin film transistors.

The first transistor 523 comprises a drain, a source, a channel well, and a gate. The source of the first transistor 523 is coupled to the electrical-positive end of the lighting module 560. The channel well of the first transistor 523 is coupled to the source of the first transistor 523. The gate of the first transistor 523 is coupled to the source of the first transistor 523. The second transistor 525 comprises a drain, a source, a channel well, and a gate. The drain of the second transistor 525 is coupled to the drain of the first transistor 523. The source of the second transistor 525 is coupled to the ground 565 of the flexible printed circuit board 550. The channel well of the second transistor 525 is coupled to the source of the second transistor 525. The gate of the second transistor 525 is coupled to the source of the second transistor 525. The third transistor 533 comprises a drain, a source, a channel well, and a gate. The source of the third transistor 533 is coupled to the electrical-negative end of the lighting module 560. The channel well of the third transistor 533 is coupled to the source of the third transistor 533. The gate of the third transistor 533 is coupled to the source of the third transistor 533. The fourth transistor 535 comprises a drain, a source, a channel well, and a gate. The source of the fourth transistor 535 is coupled to the ground 565 of the flexible printed circuit board 550. The drain of the fourth transistor 535 is coupled to the drain of the third transistor 533. The channel well of the fourth transistor 535 is coupled to the source of the fourth transistor 535. The gate of the fourth transistor 535 is coupled to the source of the fourth transistor 535. In another embodiment, the source of the second transistor 525 or the source of the fourth transistor 535 can be coupled to the ground of the LCD panel 510.

Figure 6:
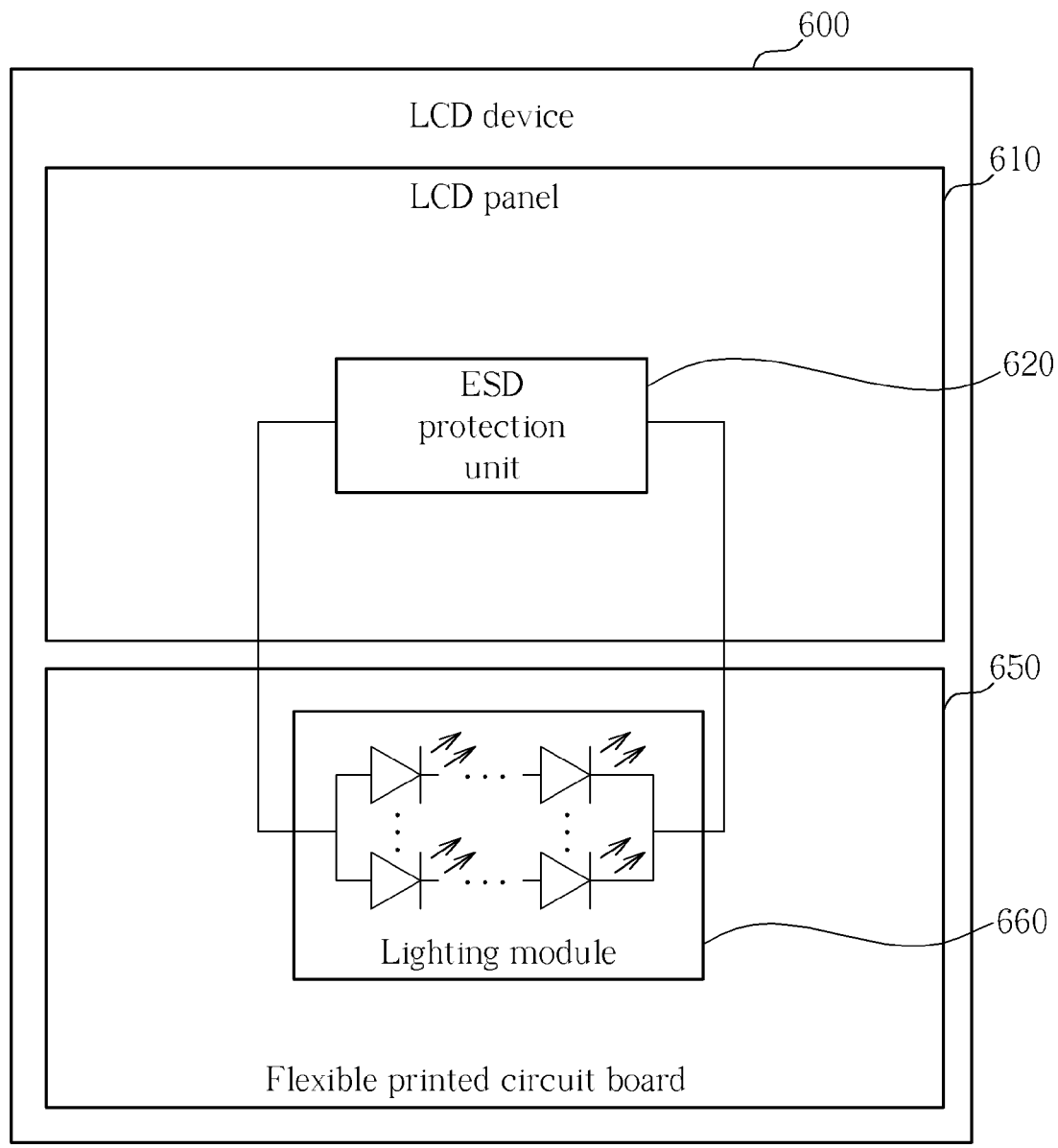
FIG. 6 is a schematic diagram showing a liquid crystal display device in accordance with a fourth embodiment of the present invention.

FIG. 6 is a schematic diagram showing a liquid crystal display device in accordance with a fourth embodiment of the present invention. As shown in FIG. 6, the liquid crystal display device 600 comprises an LCD panel 610 and a flexible printed circuit board 650. The LCD panel 610 comprises an electrostatic discharge protection unit 620. The flexible printed circuit board 650 is disposed with a lighting module 660. The lighting module 660 may comprise an LED module having an LED unit or a plurality of parallel-connected LED units. Each LED unit comprises an LED or a plurality of series-connected LEDs. The first end of the lighting module 660 is coupled to the first end of the electrostatic discharge protection unit 620. The second end of the lighting module 660 is coupled to the second end of the electrostatic discharge protection unit 620.

The electrostatic discharge protection unit 620 can be a varistor, a transient voltage suppressor, a clamp circuit, or a filter circuit. If the electrostatic discharge protection unit 620 comprises a clamp circuit, then the clamp circuit is utilized to clamp a voltage drop between the first and second ends of the lighting module 660 for avoiding unacceptable high voltage drop coming out between the first and second ends of the lighting module 660. It is noted that the lighting module 660 is damaged only when the unacceptable high voltage drop occurs between the first and second ends of the lighting module 660. That is, the lighting module 660 is in safe hands when some high voltage occurs to both the first and second ends of the lighting module 660.

If the electrostatic discharge protection unit 620 comprises a filter circuit, then the filter circuit is utilized to filter an impulse noise coming out between the first and second ends of the lighting module 660. It is noted that the lighting module 660 is also in safe hands when balance impulse noises occur to both sides of the lighting module 660. In one embodiment, the filter circuit can be a capacitor for performing high-pass filter operations and balancing the impulse noises at both sides of the lighting module 660.

In summary, the electrostatic discharge protection mechanism for the lighting module 660 is provided based on the electrostatic discharge protection unit 620 of the LCD panel 610 in the liquid crystal display device 600. In other words, the electrostatic discharge protection unit 620 for protecting the lighting module 660 is not required to be disposed on the flexible printed circuit board 650. That is, compared to the prior art, the layout and fabrication of the flexible printed circuit board 650 can be simplified significantly, and the layout area of the flexible printed circuit board 650 can be reduced significantly.

To sum up, the liquid crystal display device of the present invention provides the electrostatic discharge protection mechanism for protecting the lighting module disposed on the flexible printed circuit board by making use of the electrostatic discharge protection units disposed in the LCD panel. As a result, the layout and fabrication of the flexible printed circuit board can be simplified significantly, and furthermore, the layout area of the flexible printed circuit board can be reduced significantly.

The present invention is by no means limited to the embodiments as described above by referring to the accompanying drawings, which may be modified and altered in a variety of different ways without departing from the scope of the present invention. Thus, it should be understood by those skilled in the art that various modifications, combinations, sub-combinations and alternations might occur depending on design requirements and other factors insofar as they are within the scope of the appended claims or the equivalents thereof.

What is claimed is:

1. A liquid crystal display device comprising:
    a flexible printed circuit board;
    an LCD panel;
    a lighting module disposed on the flexible printed circuit board;
    a first electrostatic discharge protection unit disposed in the LCD panel, the first electrostatic discharge protection unit comprising:
        a first end coupled to a first end of the lighting module; and
        a second end coupled to a ground of the flexible printed circuit board or a ground of the LCD panel; and
    a second electrostatic discharge protection unit disposed in the LCD panel, the second electrostatic discharge protection unit comprising:
        a first end coupled to a second end of the lighting module; and
        a second end coupled to the ground of the flexible printed circuit board or the ground of the LCD panel.

2. The liquid crystal display device of claim 1, wherein the first electrostatic discharge protection unit and the second electrostatic discharge protection unit are varistors.

3. The liquid crystal display device of claim 1, wherein the first electrostatic discharge protection unit and the second electrostatic discharge protection unit are transient voltage suppressors.

4. The liquid crystal display device of claim 1, wherein the first electrostatic discharge protection unit and the second electrostatic discharge protection unit are clamp circuits for clamping voltage levels at the first and second ends of the lighting module.

5. The liquid crystal display device of claim 1, wherein the first electrostatic discharge protection unit and the second electrostatic discharge protection unit are filter circuits for filtering impulse noises at the first and second ends of the lighting module.

6. The liquid crystal display device of claim 1, wherein the first electrostatic discharge protection unit and the second electrostatic discharge protection unit are capacitors.

7. The liquid crystal display device of claim 1, wherein the lighting module is an LED module having an LED unit or a plurality of parallel-connected LED units, each LED unit comprises an LED or a plurality of series-connected LEDs.

8. The liquid crystal display device of claim 7, wherein:
the first electrostatic discharge protection unit comprises a first transistor, the first transistor comprises:
- a drain coupled to an electrical-positive end of the LED module;
- a source coupled to the ground of the flexible printed circuit board or the ground of the LCD panel;
- a channel well coupled to the source of the first transistor; and
- a floating gate; and the second electrostatic discharge protection unit comprises a second transistor, the second transistor comprises:
- a source coupled to an electrical-negative end of the LED module;
- a drain coupled to the ground of the flexible printed circuit board or the ground of the LCD panel;
- a channel well coupled to the source of the second transistor; and
- a floating gate.

9. The liquid crystal display device of claim 8, wherein the first transistor and the second transistor are MOS field effect transistors.

10. The liquid crystal display device of claim 8, wherein the first transistor and the second transistor are thin film transistors.

11. The liquid crystal display device of claim 7, wherein:
the first electrostatic discharge protection unit comprises:
a first transistor comprising:
- a source coupled to an electrical-positive end of the LED module;
- a drain;
- a channel well coupled to the source of the first transistor; and
- a gate coupled to the source of the first transistor; and a second transistor comprising:
- a drain coupled to the drain of the first transistor;
- a source coupled to the ground of the flexible printed circuit board or the ground of the LCD panel;
- a channel well coupled to the source of the second transistor; and
- a gate coupled to the source of the second transistor; and the second electrostatic discharge protection unit comprises:
a third transistor comprising:
- a source coupled to an electrical-negative end of the LED module;
- a drain;
- a channel well coupled to the source of the third transistor; and
- a gate coupled to the source of the third transistor; and a fourth transistor comprising:
- a drain coupled to the drain of the third transistor;
- a source coupled to the ground of the flexible printed circuit board or the ground of the LCD panel;
- a channel well coupled to the source of the fourth transistor; and
- a gate coupled to the source of the fourth transistor.

12. The liquid crystal display device of claim 11, wherein the first transistor, the second transistor, the third transistor, and the fourth transistor are MOS field effect transistors.

13. The liquid crystal display device of claim 11, wherein the first transistor, the second transistor, the third transistor, and the fourth transistor are thin film transistors.

* * * * *